(12) United States Patent
Ophir et al.

(10) Patent No.: US 11,783,466 B2
(45) Date of Patent: *Oct. 10, 2023

(54) MACHINE LEARNING FOR METROLOGY MEASUREMENTS

(71) Applicant: KLA CORPORATION, Milpitas, CA (US)

(72) Inventors: Boaz Ophir, Haifa (IL); Yehuda Odes, Kiryat Ata (IL); Udi Shusterman, Ramat Rachel (IL)

(73) Assignee: KLA CORPORATION, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/844,791

(22) Filed: Jun. 21, 2022

(65) Prior Publication Data

US 2022/0318987 A1 Oct. 6, 2022

Related U.S. Application Data

(63) Continuation of application No. 16/640,783, filed as application No. PCT/US2019/068219 on Dec. 23, 2019, now Pat. No. 11,410,290.

(Continued)

(51) Int. Cl.
*G06K 9/00* (2022.01)
*G06T 7/00* (2017.01)
(Continued)

(52) U.S. Cl.
CPC .......... *G06T 7/0004* (2013.01); *G01B 11/272* (2013.01); *G06N 3/08* (2013.01);
(Continued)

(58) Field of Classification Search
CPC ......... G06T 7/0004; G06T 2207/20052; G06T 2207/20056; G06T 2207/20081;
(Continued)

(56) References Cited

U.S. PATENT DOCUMENTS

| | | | |
|---|---|---|---|
| 2004/0267397 A1* | 12/2004 | Doddi | G01B 11/24 700/121 |
| 2009/0063378 A1* | 3/2009 | Izikson | G03F 7/70633 706/21 |

(Continued)

OTHER PUBLICATIONS

TIPO, Office Action for TW Application No. 109100112, dated Jul. 7, 2023.

*Primary Examiner* — Samir A Ahmed
(74) *Attorney, Agent, or Firm* — HODGSON RUSS LLP

(57) ABSTRACT

Metrology methods, modules and systems are provided, for using machine learning algorithms to improve the metrology accuracy and the overall process throughput. Methods comprise calculating training data concerning metrology metric(s) from initial metrology measurements, applying machine learning algorithm(s) to the calculated training data to derive an estimation model of the metrology metric(s), deriving measurement data from images of sites on received wafers, and using the estimation model to provide estimations of the metrology metric(s) with respect to the measurement data. While the training data may use two images per site, in operation a single image per site may suffice—reducing the measurement time to less than half the current measurement time. Moreover, confidence score(s) may be derived as an additional metrology and process control, and deep learning may be used to enhance the accuracy and/or speed of the metrology module.

10 Claims, 2 Drawing Sheets

Related U.S. Application Data

(60) Provisional application No. 62/787,549, filed on Jan. 2, 2019.

(51) Int. Cl.
*G01B 11/27* (2006.01)
*G06N 3/08* (2023.01)

(52) U.S. Cl.
CPC ............ *G06T 2207/20052* (2013.01); *G06T 2207/20056* (2013.01); *G06T 2207/20081* (2013.01); *G06T 2207/20084* (2013.01); *G06T 2207/30148* (2013.01)

(58) Field of Classification Search
CPC .......... G06T 2207/20084; G06T 2207/30148; G01B 11/272; G06N 3/08; G06N 20/10; G03F 7/705; G03F 7/70633
See application file for complete search history.

(56) References Cited

U.S. PATENT DOCUMENTS

| | | | |
|---|---|---|---|
| 2012/0163852 A1* | 6/2012 | Kimura | G03G 15/5062 399/82 |
| 2013/0163852 A1* | 6/2013 | Ghinovker | G06T 7/0004 257/E23.179 |
| 2013/0304399 A1* | 11/2013 | Chen | G01N 21/956 702/40 |
| 2014/0066475 A1* | 3/2014 | Oksche | A61K 31/485 514/295 |
| 2015/0235108 A1* | 8/2015 | Pandev | G01N 21/9501 382/149 |
| 2015/0323471 A1* | 11/2015 | Sapiens | G01N 21/93 356/243.4 |
| 2016/0033877 A1 | 2/2016 | Smilde et al. | |
| 2016/0110858 A1* | 4/2016 | Liu | G06T 7/41 382/149 |
| 2016/0141193 A1* | 5/2016 | Pandev | G06N 20/00 702/81 |
| 2016/0161863 A1* | 6/2016 | Den Boef | G01B 11/24 355/72 |
| 2017/0061604 A1* | 3/2017 | Pandev | G06V 20/66 |
| 2017/0109646 A1* | 4/2017 | David | G06N 7/005 |
| 2017/0287751 A1* | 10/2017 | Kuznetsov | G03F 7/70633 |
| 2019/0347527 A1 | 11/2019 | Bhaviripudi et al. | |
| 2019/0378012 A1* | 12/2019 | Tripodi | G01B 11/02 |

* cited by examiner

MACHINE LEARNING FOR METROLOGY MEASUREMENTS

CROSS REFERENCE TO RELATED APPLICATIONS

This application is a continuation of U.S. patent application Ser. No. 16/640,783 filed Feb. 21, 2020, which is a national stage of PCT/US2019/068219 filed Dec. 23, 2019, which claims the benefit of U.S. Provisional Patent Application No. 62/787,549 filed on Jan. 2, 2019, all of which are incorporated herein by reference in their entirety.

BACKGROUND OF THE INVENTION

1. Technical Field

The present invention relates to the field of semiconductor metrology, and more particularly, to implementation of machine learning in the metrology measurement process.

2. Discussion of Related Art

Typical metrology measurements of targets on wafer site estimate the overlay between target structures in images of the targets, usually for two images per target (0° and 180°-rotated images) to achieve good accuracy.

SUMMARY OF THE INVENTION

The following is a simplified summary providing an initial understanding of the invention. The summary does not necessarily identify key elements nor limit the scope of the invention, but merely serves as an introduction to the following description.

One aspect of the present invention provides a method comprising calculating training data concerning at least one metrology metric from initial metrology measurements, applying at least one machine learning algorithm to the calculated training data to derive an estimation model of the at least one metrology metric, deriving measurement data from images of sites on received wafers, and using the estimation model to provide estimations of the at least one metrology metric with respect to the measurement data.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
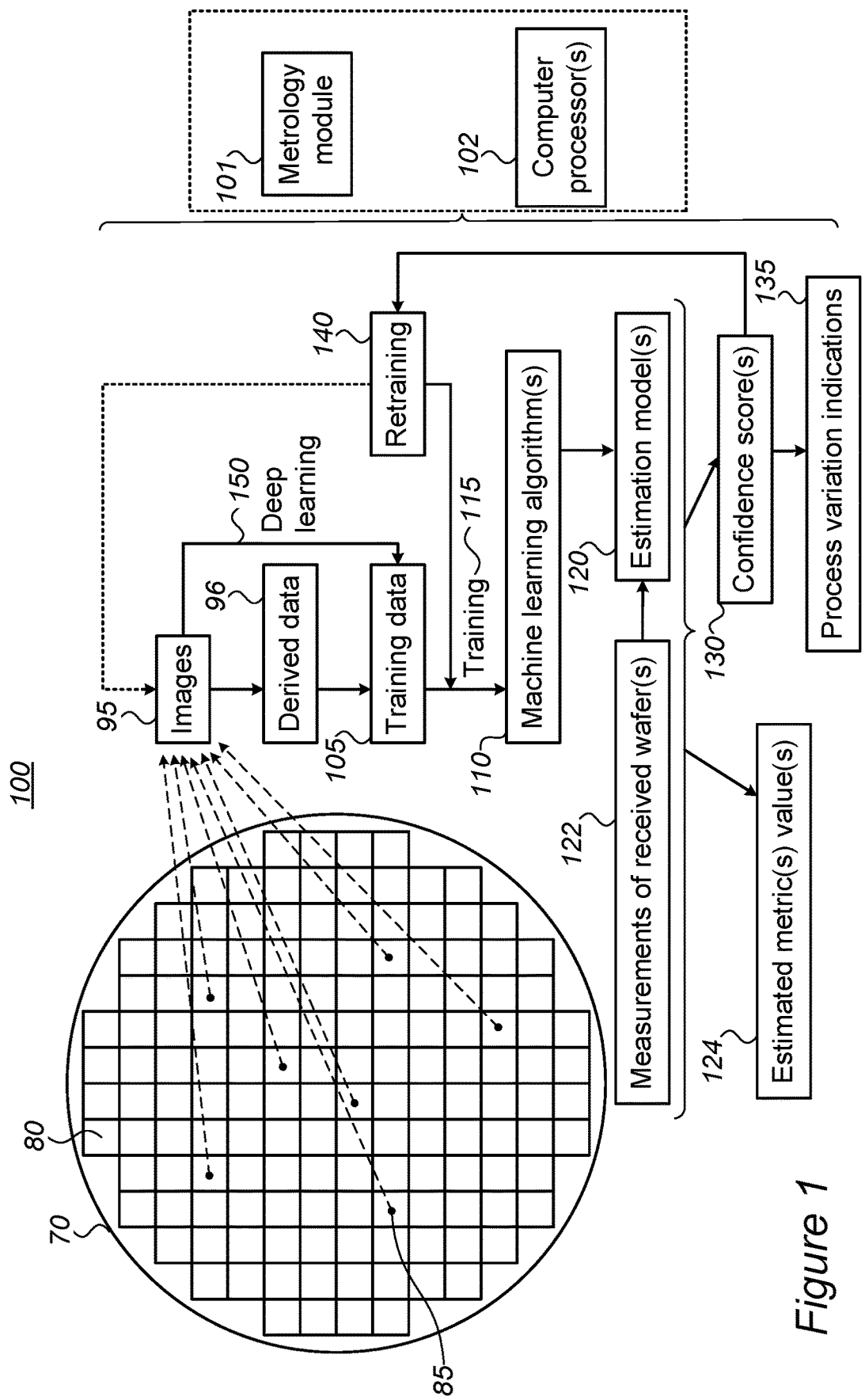
FIG. 1 is a high-level schematic block diagram and illustration of a system with a metrology module, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing", "deriving" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices. In certain embodiments, illumination technology may comprise, electromagnetic radiation in the visual range, ultraviolet or even shorter wave radiation such as x rays, and possibly even particle beams.

Embodiments of the present invention provide efficient and economical methods and mechanisms for implementing metrology measurements in semiconductor production processes and thereby provide improvements to the technological field of semiconductor metrology. Metrology methods, modules and systems are provided, for using machine learning algorithms to improve the metrology accuracy and the overall process throughput. Methods comprise calculating training data concerning metrology metric(s) from initial metrology measurements, applying machine learning algorithm(s) to the calculated training data to derive an estimation model of the metrology metric(s), deriving measurement data from images of sites on received wafers, and using the estimation model to provide estimations of the metrology metric(s) with respect to the measurement data. While the training data may use two images per site, in operation a single image per site may suffice—reducing the measurement time to less than half the current measurement time. Moreover, confidence score(s) may be derived as an additional metrology and process control, and deep learning may be used to enhance the accuracy and/or speed of the metrology module.

FIG. 1 is a high-level schematic block diagram and illustration of a system 100 with a metrology module 101, according to some embodiments of the invention. System 100 may comprise metrology module 101 associated with at least one computer processor(s) 102 and/or metrology module 101 comprising at least one, or some of computer processor(s) 102.

Metrology module 101 may comprise, or be associated with one or more estimation model(s) 120, which may be implemented on computer processor(s) 102 as part of metrology module 101 or associated therewith, e.g., as training or simulation module(s) that are used to derive estimation model(s) 120. Estimation model(s) 120 may be configured to provide estimations of at least one metrology metric with respect to measurement data of sites on received wafers. Estimation model(s) 120 are derived by at least one machine learning algorithm 110 which is applied to calculated training data 105 in a training stage 115 that relates the at least one metrology metric to initial metrology measurements.

Metrology module 101 may be configured to calculate training data 105 concerning the metrology metric(s) from the initial metrology measurements, e.g., relating to multiple sites 85 in a plurality of fields 80 of one or more training wafer 70; to apply machine learning algorithm(s) 110 to calculated training data 105 to derive estimation model 120 of the metrology metric(s); to derive measurement data 122 from images of sites on the received wafers, and to use estimation model 120 to provide estimations of the metrology metric(s) 124 with respect to measurement data 122.

For example, the calculation of training data 105 may comprise using pairs of images 95 and 180°-rotated images 95 derived from sites 85 on at least one training wafer 70. Training data 105 comprises at least one processed feature 96 (as derived data 96) which is derived from each pair of images 95 with respect to each site 85. For example, the processed feature(s) may comprise 1D (one-dimensional) kernels representing an average along a specified direction in respective images 95 and/or image transformation data comprising DCT (discrete cosine transform) or Fourier transform of respective images 95.

In certain embodiments, machine learning algorithm(s) 110 may comprise any of Principal Component Regression, Support Vector Machines, Gradient Boosting and/or Neural Networks algorithms.

In certain embodiments, training data 105 may comprise, at least partly, raw images 95 derived from plurality of sites 85 on one or more training wafer(s) 70 as the initial metrology measurements, and machine learning algorithm(s) 110 comprises at least one deep learning algorithm applying deep learning methods 150 directly to raw or processed images 95 as training data 105.

In certain embodiments, metrology module 101 may be configured to derive at least one confidence score 130 that quantifies a similarity between measurement data 122 and training data 105 and to use derived confidence score(s) 130 as a confidence measure for the estimations of the at least one metrology metric. Metrology module 101 may be further configured to reiterate the estimation model derivation using additional calculated training data, e.g., in a re-training stage 140, to re-train machine learning algorithm(s) 110, in case confidence score(s) surpasses respective specified threshold(s). Alternatively, or complementarily, confidence score(s) 130 may be used to provide process variation indications 135 such as relating to various process errors.

Figure 2:
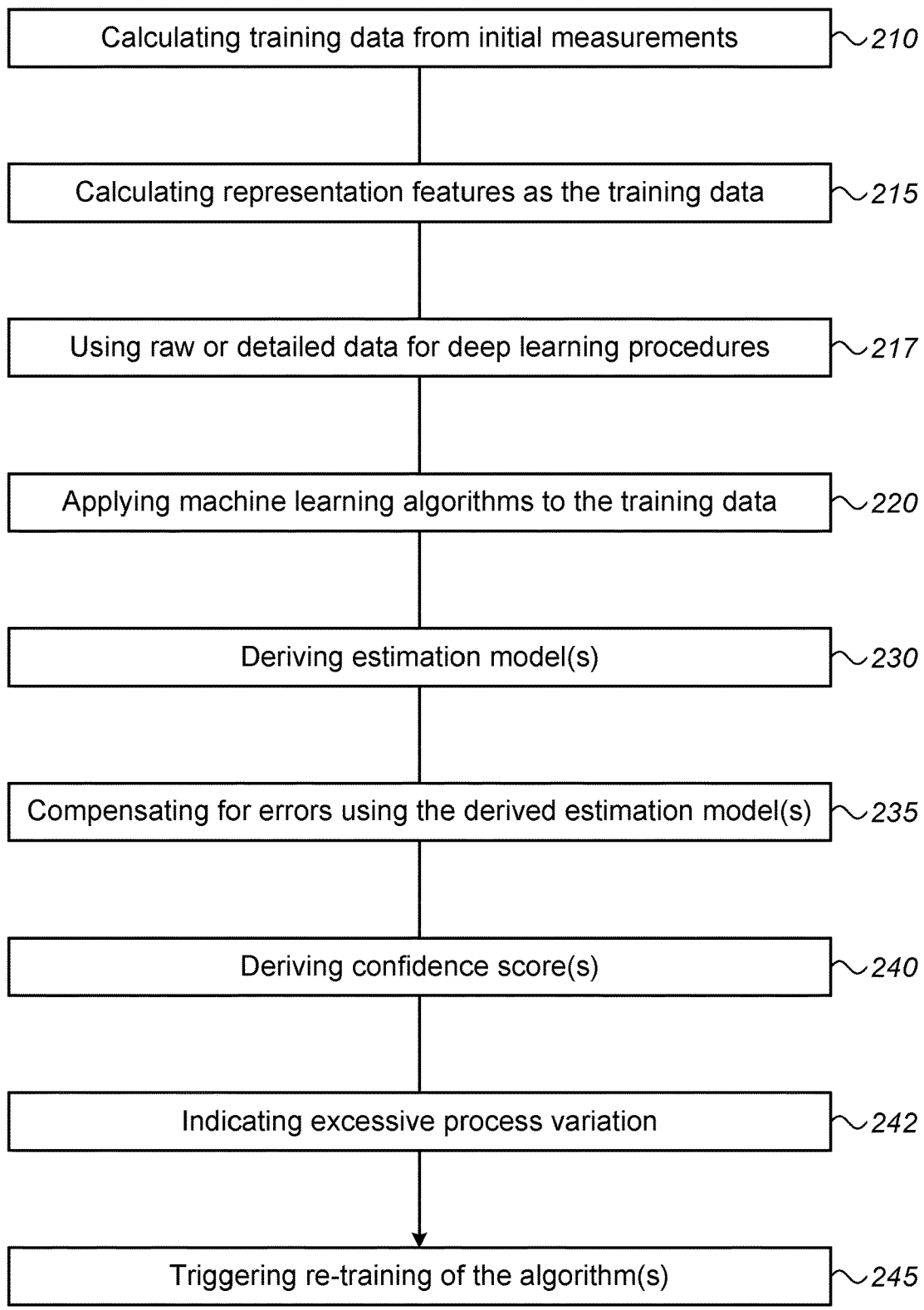
FIG. 2 is a high-level flowchart illustrating a method, according to some embodiments of the invention.

FIG. 2 is a high-level flowchart illustrating a method 200, according to some embodiments of the invention. The method stages may be carried out with respect to system 100 and/or metrology module 101 described above, which may optionally be configured to implement method 200. Method 200 may be at least partially implemented by at least one computer processor (e.g., 102), possibly in metrology module 101. Certain embodiments comprise computer program products comprising a computer readable storage medium having computer readable program embodied therewith and configured to carry out the relevant stages of method 200. Certain embodiments comprise target design files of respective targets designed by embodiments of method 200. Method 200 may comprise the following stages, irrespective of their order.

Method 200 comprises calculating training data concerning at least one metrology metric from initial metrology measurements (stage 210), applying at least one machine learning algorithm to the calculated training data (stage 220) to derive an estimation model of the at least one metrology metric (stage 230). For example, calculating training data 210 may comprise Calculating representation features as the training data (stage 215) and/or using raw or detailed data (stage 217), e.g., for deep learning procedures. Method 200 further comprises deriving measurement data from images of sites on received wafers (stage 232), and using the estimation model to provide estimations of the at least one metrology metric with respect to the measurement data (stage 235) and optionally compensating for process errors using the derived estimation model(s) (stage 237).

For example, method 200 may comprise carrying out the calculation of the training data using pairs of images and 180°-rotated images derived from a plurality of sites on at least one training wafer.

In certain embodiments, the training data may comprise at least one processed feature which is derived from each pair with respect to each site, the at least one processed feature comprises 1D (one-dimensional) representing an average along a specified direction in the respective images and/or image transformation data comprising DCT (discrete cosine transform) or Fourier transform of the respective images. Alternatively or complementarily the at least one processed feature may comprise any of various accuracy metrics derived from captured images.

In certain embodiments, the machine learning algorithm(s) may comprise at least one of: Principal Component Regression, Support Vector Machines, Gradient Boosting and/or Neural Networks algorithms.

In certain embodiments, the training data may comprise, at least partly, raw images derived from sites on the training wafer(s) as the initial metrology measurements, and the machine learning algorithm(s) may comprise at least one deep learning algorithm.

Method 200 may further comprise deriving at least one confidence score that quantifies a similarity between the measurement data and the training data and is used as a confidence measure for the estimations of the at least one metrology metric (stage 240). Confidence score(s) may be used to indicate excessive process variation (stage 242) and/or reiterating the estimation model derivation using additional calculated training data, to re-train the machine learning algorithm(s), in case one or more of the confidence score(s) surpasses respective specified threshold(s) (stage 245).

For example, disclosed embodiments may comprise estimating TIS (tool induced shifts, mainly from optics-related inaccuracies and expressed by the difference between measurements rotated by 180° with respect to each other) and/or overlay as the metrology metric(s), e.g., estimation model(s)

120 may comprise computational model(s) that estimate TIS, possibly from single measurements 122 per site. Training data 105 may comprise a limited number of images 95 taken from multiple sites 85 with known TIS, e.g., including 180°-rotated images for these sites, namely using two measurements per site 85 for deriving training data 105. Training data 105 may be derived with respect to various representation features such as 1D kernels representing the averages of a given dimension in 2D images 95, DCT representations of image 95, various metrics relating to images 95, etc. Such features may help to gain more knowledge than is explicit in measured images 95, while allowing for simple computations for training data 105 and metric estimations 124, by reducing the relatively large pixel space to more compact representations. In certain embodiments, by creating feature-based model 120 on single wafer 70, the TIS or other metrics may be estimated and compensated for, e.g., site by site in many similar (received) wafers measured on the same metrology tool (e.g., having metrology module 101), thus increasing the quality of overlay and other metrology measurements with a negligible penalty in throughput.

It is noted that disclosed methods 200 and systems 100 may be used in optical metrology measurements to minimize TIS errors which are caused by imperfections in the measurement devices (e.g., due to telecentricity, lens aberrations, etc.) that may be manifested in different overlays (indications of the misalignment of two or more vertically consecutive layer patterns in a semiconductor wafer) between measurements taken on the same target at 0° and 180° azimuths (measured by rotating the wafer by 180°). Disclosed embodiments may at least statistically minimize the TIS errors across the wafer, as observed in the mean and standard deviation of the values across the wafer.

Confidence score(s) 130 may be used to score inputs such as measurements 122 with respect to the similarity between measurements 122 and training data 105, to provide a confidence measure to estimated metric values 124 such as the TIS prediction. By monitoring confidence score 130, process variations occurring in the production process may be indicated 135 and/or re-training of model 120 may be triggered 140 to cope with identified changes in the process. Various embodiments yield higher quality results while maintaining high throughput as opposed to current methods of reducing TIS discussed below. Disclosed systems 100 and methods 200 may be applied to minimize a range of errors in the semiconductor process analysis flow.

In certain embodiments, alternative or complementary deep learning machine learning algorithms 110 and corresponding mechanisms 150 may be applied to bypass and/or complement feature calculation stage 215. Measured images may be used as at least part of training data 105 and inputted directly into, e.g., a neural network architecture (as an example for machine learning algorithms), with TIS estimates as its output.

The inventors note that disclosed embodiments pioneer the use of machine learning algorithms for correcting mechanical and optical errors in overlay measurement in the semiconductor industry. Disclosed embodiments perform better than prior art systems and methods which require conducting each measurement twice (at 0° and 180° rotations of the target) to derive, e.g., TIS measurements and/or which optimize the hardware settings on a given set of sites and wafers and use the optimized values for all other sites and wafers. Advantageously, disclosed embodiments halve the measurement time (by using a single measurement instead of two, and also sparing the wafer movement time), improve measurement accuracy and increase the overall throughput (number of wafers processed per hour) greatly with respect to the former prior art approach, and are much more flexible, more accurate and less time-consuming with respect to the latter prior art approach (as hardware setting optimization is a very slow process, that cannot be carried out often and therefore can hardly be adjusted to changing conditions, and also provide interpolative results which may have low accuracy).

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method comprising:
a step for calculating training data concerning at least one metrology metric from initial metrology measurements using a metrology module, wherein the metrology module is associated with a processor;
applying at least one machine learning algorithm of the metrology module to the calculated training data to derive an estimation model of the at least one metrology metric with respect to measurement data of sites on received wafers, wherein the calculated training data relates the at least one metrology metric to the initial metrology measurements;
deriving the measurement data from images of the sites on the received wafers; and
a step for using the estimation model to provide estimations of the at least one metrology metric with respect to the measurement data, wherein the estimation model is implemented as part of the metrology module, and wherein the metrology metric includes tool induced shift.

2. The method of claim 1, further comprising carrying out the calculation of the training data using pairs of images and 180°-rotated images derived from a plurality of sites on at least one training wafer.

3. The method of claim 1, wherein the training data comprises at least one processed feature which is derived from a pair of images with respect to each site, the at least one processed feature comprises image transformation data including a discrete cosine transform of images.

4. The method of claim 1, wherein the training data comprises at least one processed feature which is derived from a pair of images with respect to each site, the at least one processed feature comprises image transformation data including a Fourier transform of images.

5. The method of claim 1, wherein the at least one machine learning algorithm comprises at least one of Principal Component Regression, Support Vector Machines, Gradient Boosting or Neural Networks algorithms.

6. The method of claim 1, wherein the training data comprises, at least partly, raw images derived from a plurality of sites on at least one training wafer as the initial metrology measurements, and the at least one machine learning algorithm comprises at least one deep learning algorithm.

7. The method of claim 1, further comprising deriving at least one confidence score that quantifies a similarity between the measurement data and the training data and is used as a confidence measure for the estimations of the at least one metrology metric.

8. The method of claim 7, further comprising reiterating the estimation model derivation using additional calculated training data, to re-train the at least one machine learning algorithm, in case at least one confidence score surpasses at least one specified threshold.

9. A computer program product comprising a non-transitory computer readable storage medium having computer readable program embodied therewith, the computer readable program configured to carry out the method of claim 1.

10. A metrology module comprising the computer program product of claim 9.

* * * * *